United States Patent [19]
Dydyk et al.

[11] Patent Number: 5,451,913
[45] Date of Patent: Sep. 19, 1995

[54] COMPACT MMIC TUNABLE BIPHASE MODULATOR AND METHOD

[75] Inventors: Michael Dydyk, Scottsdale; Beth A. Longbrake, Cave Creek, both of Ariz.

[73] Assignee: Motorola, Inc., Schaumburg, Ill.

[21] Appl. No.: 263,226

[22] Filed: Jun. 21, 1994

[51] Int. Cl.[6] ............................................. H03C 3/00
[52] U.S. Cl. ...................................... 332/103; 332/105
[58] Field of Search ............... 332/103, 104, 105, 144, 332/146; 375/52, 55, 62, 67, 68; 329/304, 305; 333/156

[56] References Cited

U.S. PATENT DOCUMENTS

| | | | |
|---|---|---|---|
| H954 | 8/1991 | Lang et al. | 333/164 |
| 3,484,724 | 12/1969 | Podell | 333/10 |
| 3,781,718 | 12/1973 | Gittinger | 333/11 |
| 4,398,161 | 8/1983 | Lamb et al. | 333/156 |
| 4,524,336 | 6/1985 | Franke | 332/16 R |
| 4,556,856 | 12/1985 | Presser | 333/124 |
| 4,612,520 | 9/1986 | Boire et al. | 333/156 |
| 4,638,190 | 1/1987 | Hwang et al. | 307/512 |
| 4,994,773 | 2/1991 | Chen et al. | 333/164 |
| 5,081,432 | 1/1992 | Devlin et al. | 323/103 |
| 5,166,648 | 11/1992 | Wen et al. | 333/139 |
| 5,175,517 | 12/1992 | Dydyk et al. | 333/118 |
| 5,180,998 | 1/1993 | Wilems | 333/164 |

FOREIGN PATENT DOCUMENTS 57-68917  4/1982  Japan.
63-43412  2/1988  Japan.

OTHER PUBLICATIONS

"A Lumped Element Rat Race Coupler" from Applied Microwave, by Samuel J. Parisi, Mitre Corp., Bedford, Mass., Aug./Sep. 1989.
"A Monolithic Image-Rejection Mixer On GaAs Using Lumped Elements*" by John Putnam and Richard Puente, M/A-Com Advanced Semiconductor Operations, Lowell, Mass., from Microwave Journal, Nov. 1987.

Primary Examiner—Benny Lee
Assistant Examiner—David H. Vu
Attorney, Agent, or Firm—Frederick M. Fliegel

[57] ABSTRACT

An apparatus for providing electronically tunable biphase modulation. The apparatus includes an input for supplying a signal to be modulated and a coupler including first, second, third and fourth ports. The first port is coupled to the input. The apparatus also includes a first switch coupled to the second port. The first switch operates in response to a modulating signal. The apparatus further includes a first reactance element coupled to the first switch, an output coupled to the third port, a phase-shifting network coupled to the fourth port, a second switch coupled to the phase-shifting network and a second reactance element coupled to the second switch. The second switch operates in response to a modulating signal.

20 Claims, 1 Drawing Sheet

ND METHOD

COMPACT MMIC TUNABLE BIPHASE MODULATOR AND METHOD

FIELD OF THE INVENTION

This invention relates in general to the field of biphase modulators, more specifically to biphase modulators having adjustable phase shifts and more particularly to biphase modulators having close amplitude balance between the two output modulation states.

BACKGROUND OF THE INVENTION

Biphase modulation is important for many electronic products which require digital coding of radio frequency signals, for example, PN coded signals. This type of modulation is often required together with small size, low power draw and robust operation in a broad variety of environments. Examples of such applications include munitions fuzes, radar apparatus and communications systems.

Conventional biphase modulators suffer from lack of flexibility in choosing modulation angles and are typically restricted to 0° and 180° modulation angles. Multiphase modulation schemata (e.g., QAM) typically provide phase angles of integer submultiples of 180° (e.g., 45°, 90° etc.). It has been especially uneconomical and impractical to provide close amplitude balance over significant bandwidths between signal portions having different modulation angles, particularly when modulation angles other than submultiples of 180° are required.

Thus, what is needed is a practical, economical apparatus and accompanying method for providing biphase modulation of signals with adjustable phase angles, particularly combined with close amplitude tracking between the two phase states of the modulator, in compact form having low power dissipation and providing robust performance over a broad range of operating conditions.

SUMMARY OF THE INVENTION

An apparatus for providing electronically tunable biphase modulation includes an input for supplying a signal to be modulated and a coupler having first, second, third and fourth ports. The first port is coupled to the input. The apparatus also includes a first switch having a first interconnection coupled to the second port and a first reactance element coupled between a second interconnection of the first switch and ground. The first switch operates in response to a modulating signal. The apparatus also includes an output coupled to the third port, a phase-shifting network having a first interconnection coupled to the fourth port, a second switch having a first interconnection coupled to the fourth port and a second reactance element coupled between a second interconnection of the second switch and ground. The second switch operates in response to a modulating signal.

The apparatus desirably but not essentially includes a first varactor diode and a first low frequency control signal bias network as the first reactance element. The first varactor diode has a first lead coupled to ground and a second lead coupled to the first low frequency control signal bias network and to the second interconnection of the first switch.

The apparatus desirably but not essentially includes a second varactor diode and a second low frequency control signal bias network as the second reactance element. The second varactor diode has a first lead coupled to ground and a second lead coupled to the second low frequency control signal bias network and to the second interconnection of the second switch.

The apparatus desirably but not essentially includes a coupler having a first phase shift of ninety degrees at a frequency of the signal to be modulated between the first and second ports, the second and third ports and the fourth and first ports and has a second phase shift of two hundred seventy degrees at the frequency of the signal to be modulated between the third and fourth ports.

The coupler further desirably but not essentially includes a first inductor coupled between the first port and ground, a first capacitor having a first lead coupled to the first port and a second lead coupled to the second port, a second inductor coupled between the second port and ground, a second capacitor having a first lead coupled between the second port and the third port, a third inductor having a first lead coupled to the third port and a second lead coupled to the fourth port and a third capacitor having a first lead coupled to the fourth port and a second lead coupled to the first port.

The first and second inductors desirably but not essentially have inductances $L/2$ and the third inductor has inductance $L$, wherein the inductance $L$ is $L = (2 \cdot Z_o \cdot R_L)^{0.5}/\omega_o$, wherein $\omega_o$ is a frequency of the signal to be modulated and $R_L$ is the impedance of the output of the coupler, and the first, second and third capacitors have values $C$ of $C = \omega_o (2 \cdot Z_o \cdot R_L)^{-0.5}$.

In an apparatus for providing electronically tunable biphase modulation comprising a coupler including first, second, third and fourth ports, said first port coupled to said input, a first switch including a first interconnection coupled to said second port, said first switch operating in response to a modulating signal, a first reactance element coupled between a second interconnection of said first switch and ground, an output coupled to said third port, a phase-shifting network including a first interconnection coupled to said fourth port, a second switch including a first interconnection coupled to a second interconnection of said phase-shifting network, said second switch operating in response to said modulating signal and a second reactance element coupled between a second interconnection of said second switch and ground, a method for operating a biphase modulator includes steps of supplying a signal to be modulated to the first port, opening the first switch in response to a first state of the modulating signal and closing the first switch in response to a second state of the modulating signal.

The method desirably but not essentially further includes steps of closing the second switch in response to the second state of the modulating signal and opening the second switch in response to the first state of the modulating signal.

The method further desirably includes a step of adjusting a first low frequency signal coupled to the first varactor diode to adjust a modulation angle of a first modulation state over a first range, the first range being less than ninety degrees, and a step of adjusting a second low frequency signal coupled to the second varactor diode to adjust a modulation angle of a second modulation state over the first range to provide a variable diode reactance at the second and fourth ports of the coupler.

DETAILED DESCRIPTION OF THE DRAWING

Figure 1:
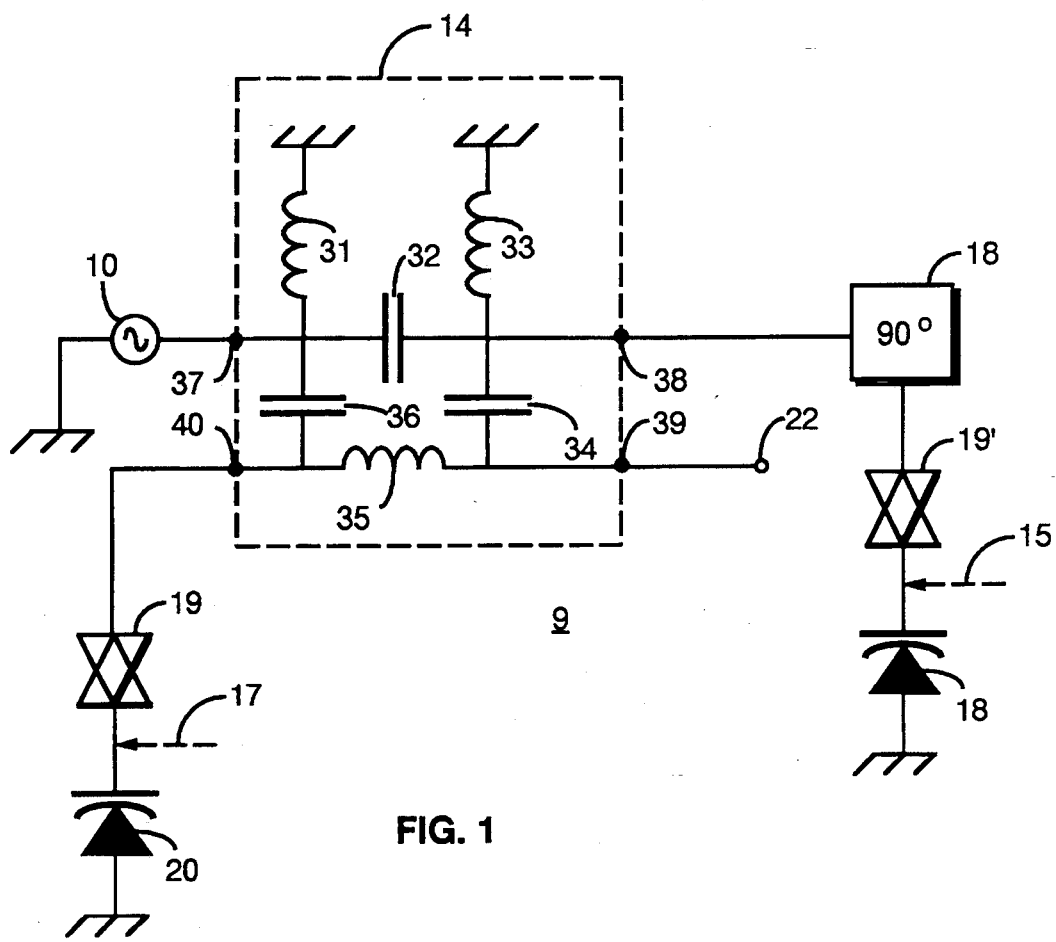
FIG. 1 is a simplified schematic diagram of a biphase modulator in accordance with the present invention.

FIG. 1 is a simplified schematic diagram of biphase modulator 9 in accordance with the present invention. Biphase modulator 9 usefully comprises coupler 14 having first port 37, second port 38, third port 39 and fourth port 40, with first port 37 of coupler 14 coupled to signal source 10. Signal source 10 provides a signal to be modulated by biphase modulator 9. First port 37 acts as an input to biphase modulator 9 while third port 39 is coupled to output 22.

Second port 38 is coupled to 90° phase shift network 18 and thereby to the combination of switch 19' and reactance element 16 while fourth port 40 is coupled to switch 19 and reactance element 20. Switches 19, 19' operate together in synchronism. Biphase modulation of the signal from signal source 10 is effecting by coupling a modulating signal to switches 19, 19'.

A nominal 180° phase shift is provided between the two modulator states by switching switches 19, 19' between "closed" (i.e., coupling fourth 40 and second 38 ports of coupler 14 to reactance element 20, 16, respectively) and "open" (i.e., coupling a shunt inductor/FET to fourth 40 and second 38 ports of coupler 14) states. The shunt inductor/FET present an impedance that is nominally 180° degrees different than that of reactance elements 16, 20.

It will be appreciated that other electronically alterable phase shift elements (e.g., FETs etc.) may be employed for electronically variable reactance elements 16, 20 or that phase shift elements of fixed value may be employed when electronic adjustment of the phase difference between modulation states is not required. In the general case, electronically variable reactance elements 16, 20 include DC bias networks (not illustrated), represented as dashed lines 15, 17, respectively, allowing electronic adjustment of the net phase shifts provided by reactance elements 16, 20, respectively, over a first frequency range via either independent adjustment or adjustment in tandem of the reactances of electronically variable reactance elements 16, 20 in response to low frequency control signals coupled to electronically variable reactance elements 16, 20 via DC bias networks 15, 17, respectively. Typically, the low frequency signals alter the degree of reverse bias of varactor diodes 16, 20, thereby modulating the capacitance and hence the reactance thereof. The relative phase of the two phase states is adjustable over a first range of phase angles, typically less than 90°. Coupling DC bias networks 15, 17 together has the advantage of only requiring a single control line.

Coupler 14, also known as a ring coupler, may be realized in lumped element form (as illustrated) or as rat race hybrid (i.e., employing transmission lines to effect phase shifts). Modulator 9 is advantageously constructed as a single MMIC circuit including a lumped element coupler 14. This implementation provides robust performance in small form factor and obviates need to select individual components (i.e., varactors 16, 20) having closely matched properties.

Figure 2:
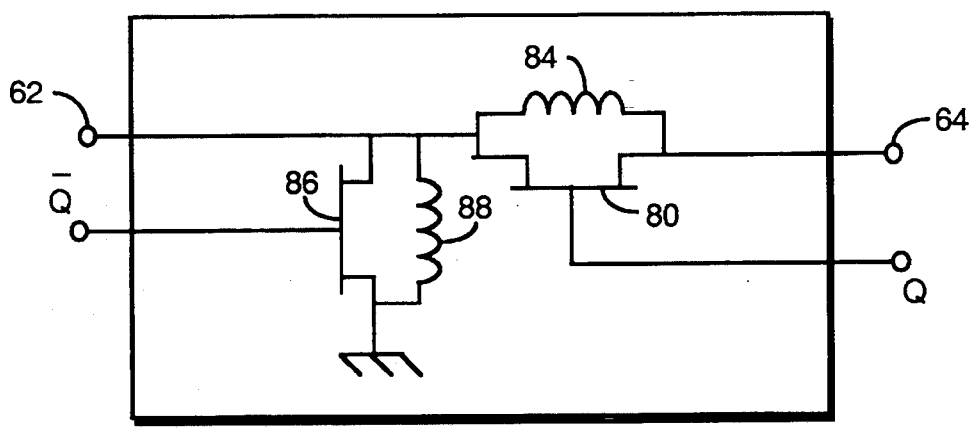
FIG. 2 is a schematic diagram of an embodiment of the switches of FIG. 1.

In one embodiment, each of switches 19, 19' comprises a series-shunt switch 60 (FIG. 2). Referring now to FIGS. 1 and 2, each series-shunt switch 60 desirably comprises a series transistor 80 having a gate coupled to one of the complementary control inputs (e.g., Q) and a source coupled to input 62 and a shunt transistor 86 having a gate coupled to another of said complementary control inputs (e.g., $\overline{Q}$), a source coupled to a first power supply (e.g., ground as illustrated) and a drain coupled to input 62 and also coupled to a drain of series transistor 80. Series inductor 84 includes a first lead coupled to input 62 and a second lead coupled to output 64. Shunt inductor 88 has a first lead coupled to input 62 and a second lead coupled to ground. It will be appreciated from inspection of FIG. 2 that when the first control signal (e.g., Q) enables series transistor 80 (i.e., switches series FET 80 to a conductive state), the complement to the first control signal (e.g., $\overline{Q}$) renders shunt series FET 86 nonenabled, i.e., nonconductive. Thus, in this state, signals present at port 62 are coupled to port 64 (and vice versa; signals present at port 64 are coupled to port 62). In the other state, signals present at port 62 are coupled to ground. Input 62 is coupled to coupler 14 while output 64 is coupled to impedance elements 20 or 18.

EXAMPLE

A modulator was monolithically implemented employing lumped-element equivalent values as given in Table I below through the foundry services of TriQuint Semiconductor.

The values provided in Table I include compensation for the effects of nonidealities in realizing elements 31–36 (i.e., parasitic resistance, capacitance etc.) and also reflect adjustment to accommodate the desired signal bandwidth. This modulator provides roughly twenty degrees of tuning range via biases applied to reactance elements 16, 20, realized as varactor diodes having a 300 micrometer periphery.

TABLE I

| Element values for the tunable biphase modulator. ||
| ELEMENT | VALUE |
| --- | --- |
| 31 | 0.81 nH |
| 32 | 0.45 pF |
| 33 | 0.81 nH |
| 34 | 0.46 pF |
| 35 | 1.64 nH |
| 36 | 0.60 pF |

In the test biphase modulator circuit, DC bias networks 15, 17 were coupled to a common control signal line and provided with control signal voltages of 0 to −2 volts. This modulator employed GaAs MESFET switches for switches 19, 19'. Each switch 19, 19' comprises a series FET in series with reactance element 16 or 20 and a 1.43 nH inductor coupled from the source to the drain of the series FET. Each switch also comprises a shunt FET coupled in shunt with node 38 or 40 and a 2.0 nH inductor coupled in shunt with the shunt FET. The inductors act primarily to reduce the impedance of the open-circuited switch (e.g., from circa 20 kΩ, $R_{ds}$, in shunt with the parasitic drain-source capacitance $C_{ds}$ of the FET to circa 2 kΩ), reducing the disparity in impedance observed at ports 38, 40 between the open-circuited and short-circuited switch states, thus improving the amplitude balance of biphase modulator 9. The switch arrangement comprising switches 19, 19' requires only four FETs, providing high performance in a small footprint. 90° phase shift network 18 is conveniently realized as a 0.72 pF capacitor coupled from fourth port 40 to ground and a 1.42 nH inductor coupled between fourth port 40 and switch 19.

The exemplary modulator maintains a measured 1 dB amplitude balance between the first and second signal path signals over a 10% fractional bandwidth when the first and second signal paths are set, through DC signals directed to electronically variable reactance elements 16, 20 via DC bias networks 15, 17, respectively, to maintain a phase difference between the first and second paths of 172 degrees. The component values provided in Table I were chosen to accommodate impedance variations of electronically variable reactance elements 16, 20 with bias while maintaining the close amplitude balance desired for biphase modulator 9 together with continuous adjustability of the modulation angle between the two phase states of the biphase modulator 9.

The 300 micrometer diodes employed in this example have impedances ranging from 51−j36Ω at zero volts bias to 52.4−j96Ω at two volts reverse bias.

This example provides roughly twenty degrees of phase shift change when the control voltage coupled to variable reactance elements 16, 20 is varied over the range 0 to −2 volts. Thus, tunable biphase modulator 9 has been described which overcomes specific problems and accomplishes certain advantages relative to prior art methods and mechanisms. The improvements over known technology are significant. The expense, complexities and high parts count of modulators assembled from discrete components are avoided. Similarly, fabrication in monolithic form facilitates achieving balanced structures (i.e., similar reactance elements 16, 20) required to provide close control of the phase difference and the amplitude balance in the modulated signal, while simultaneously providing very small form factor, light weight and robust circuitry.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An apparatus for providing electronically tunable biphase modulation, said apparatus comprising:
   an input for supplying a signal to be modulated;
   a coupler including first, second, third and fourth ports, said first port coupled to said input;
   a first switch including a first interconnection coupled to said second port, said first switch operating in response to a modulating signal;
   a first reactance element coupled between a second interconnection of said first switch and ground;
   an output coupled to said third port;
   a phase-shifting network including a first interconnection coupled to said fourth port;
   a second switch including a first interconnection coupled to a second interconnection of said phase-shifting network, said second switch operating in response to a modulating signal; and
   a second reactance element coupled between a second interconnection of said second switch and ground.

2. An apparatus as claimed in claim 1, wherein said first reactance element comprises a first varactor diode and a first low frequency control signal bias network, said first varactor diode including a first lead coupled to ground and a second lead coupled to said first low frequency control signal bias network and to said second interconnection of said first switch.

3. An apparatus as claimed in claim 2, wherein said second reactance element comprises a second varactor diode and a second low frequency control signal bias network, said second varactor diode including a first lead coupled to ground and a second lead coupled to said second low frequency control signal bias network and to said second interconnection of said second switch.

4. An apparatus as claimed in claim 3, wherein said coupler comprises a lumped element ring hybrid.

5. An apparatus as claimed in claim 1, wherein said coupler comprises a rat race hybrid.

6. An apparatus as claimed in claim 1, wherein said coupler includes a first phase shift between said first and second ports, said second and third ports and said fourth and first ports and a second phase shift between said third and fourth ports.

7. An apparatus as claimed in claim 1, wherein said coupler includes a first phase shift of ninety degrees at a frequency of said signal to be modulated between said first and second ports, said second and third ports and said fourth and first ports and a second phase shift of two hundred seventy degrees at said frequency of said signal to be modulated between said third and fourth ports.

8. An apparatus as claimed in claim 7, wherein said coupler comprises:
   a first inductor coupled between said first port and ground;
   a first capacitor including a first lead coupled to said first port and a second lead coupled to said second port;
   a second inductor coupled between said second port and ground;
   a second capacitor including a first lead coupled between said second port and said third port;
   a third inductor including a first lead coupled to said third port and a second lead coupled to said fourth port; and
   a third capacitor including a first lead coupled to said fourth port and a second lead coupled to said first port.

9. An apparatus as claimed in claim 8, wherein said first and second inductors have inductances L/2 and said third inductor has inductance L, wherein said inductance L is:

$$L = (2 \cdot Z_o \cdot R_L)^{0.5}/w_o,$$

wherein $w_o$ is a radian frequency of said signal to be modulated and $R_L$ is an impedance of said third port.

10. An apparatus as claimed in claim 8, wherein said first, second and third capacitors have values C given as:

$$C = w_o(2 \cdot Z_o \cdot R_L)^{-0.5}.$$

11. An apparatus as claimed in claim 1, wherein said first switch comprises:
   a first shunt FET including a drain coupled to said first interconnection of said first switch, a source coupled to ground and a gate coupled to a first modulating signal;
   a first shunt inductor including a first lead coupled to said first interconnection of said first switch and a second lead coupled to ground;
   a first series FET including a source coupled to said second interconnection of said first switch, a drain coupled to said first interconnection of said first switch and a gate coupled to a second modulating signal; and
   a first series inductor including a first lead coupled to said first interconnection of said first switch and a second lead coupled to said second interconnection of said first switch.

12. An apparatus as claimed in claim 11, wherein said second switch comprises:
   a second shunt FET including a drain coupled to said first interconnection of said second switch, a source coupled to ground and a gate coupled to said first modulating signal;
   a second shunt inductor including a first lead coupled to said first interconnection of said second switch and a second lead coupled to ground;
   a second series FET including a source coupled to said second interconnection of said second switch, a drain coupled to said first interconnection of said second switch and a gate coupled to said second modulating signal; and
   a second series inductor including a first lead coupled to said first interconnection of said second switch and a second lead coupled to said second interconnection of said second switch.

13. An apparatus as claimed in claim 12, wherein said first modulating signal is a complement of said second modulating signal.

14. A method for operating an electronically tunable biphase modulation apparatus, said method comprising steps of:
   supplying a signal to be modulated to a first port of a coupler including first, second, third and fourth ports, said first port coupled to an input of said apparatus, said apparatus further comprising a first switch including a first interconnection coupled to said second port, said first switch operating in response to a modulating signal; a first reactance element coupled between a second interconnection of said first switch and ground; an output coupled to said third port; a phase-shifting network including a first interconnection coupled to said fourth port; a second switch including a first interconnection coupled to a second interconnection of said phase-shifting network, said second switch operating in response to said modulating signal; and a second reactance element coupled between a second interconnection of said second switch and ground;
   opening said first switch in response to a first state of said modulating signal; and
   closing said first switch in response to a second state of said modulating signal.

15. A method as claimed in claim 14, further comprising steps of:
   opening said second switch in response to said first state of said modulating signal; and
   closing said second switch in response to said second state of said modulating signal.

16. A method as claimed in claim 14, wherein said first reactance element further comprises a first varactor diode including a first lead coupled to ground and a first low frequency bias network coupled to a second lead of said first varactor diode, wherein said method comprises a step of adjusting a first low frequency signal coupled to said first varactor diode to adjust a modulation angle of a first modulation state over a first range, said first range being less than ninety degrees.

17. A method as claimed in claim 16, wherein said second reactance element further comprises a second varactor diode including a first lead coupled to ground and a second low frequency bias network coupled to a second lead of said first varactor diode, wherein said method comprises a step of adjusting a second low frequency signal coupled to said second varactor diode to adjust a modulation angle of a second modulation state over said first range.

18. An apparatus for providing electronically tunable biphase modulation, said apparatus comprising:
   an input for supplying a signal to be modulated;
   a coupler including first, second, third and fourth ports, said first port coupled to said input;
   a first switch including a first interconnection coupled to said second port, said first switch operating in response to a modulating signal;
   a first reactance element coupled between a second interconnection of said first switch and ground, said first reactance element comprising a first varactor diode and a first low frequency control signal bias network, said first varactor diode including a first lead coupled to ground and including a second lead coupled to said first low frequency control signal bias network and to said second interconnection of said first switch;
   an output coupled to said third port;
   a phase-shifting network including a first interconnection coupled to said fourth port;
   a second switch including a first interconnection coupled to a second interconnection of said phase-shifting network, said second switch operating in response to said modulating signal; and
   a second reactance element coupled between a second interconnection of said second switch and ground, said second reactance element comprising a second varactor diode and a second low frequency control signal bias network, said second varactor diode including a first lead coupled to ground and including a second lead coupled to said second low frequency control signal bias network and to said second interconnection of said second switch.

19. An apparatus as claimed in claim 18, wherein said coupler has a first phase shift of ninety degrees at a frequency of said signal to be modulated between said first and second ports, said second and third ports and said fourth and first ports and has a second phase shift of two hundred seventy degrees at said frequency of said signal to be modulated between said third and fourth ports, said coupler comprising:
   a first inductor coupled between said first port and ground;

a first capacitor including a first lead coupled to said first port and a second lead coupled to said second port;

a second inductor coupled between said second port and ground;

a second capacitor including a first lead coupled between said second port and said third port;

a third inductor including a first lead coupled to said third port and a second lead coupled to said fourth port; and a third capacitor coupled between said fourth port and said first port.

20. An apparatus as claimed in claim 19, wherein: said first and second inductors have inductances $L/2$ and said third inductor has inductance $L$, wherein said inductance $L$ is:

$$L = (2 \cdot Z_o \cdot R_L)^{0.5}/w_o,$$

wherein $w_o$ is a radian frequency of said signal to be modulated and $R_L$ is an impedance of said third port; and said first, second and third capacitors have values $C$ given as:

$$C = w_o(2 \cdot Z_o \cdot R_L)^{-0.5}.$$

* * * * *